(12) United States Patent
Nakamori et al.

(10) Patent No.: US 12,117,285 B2
(45) Date of Patent: Oct. 15, 2024

(54) PERMITTIVITY MEASURING DEVICE AND THICKNESS MEASURING DEVICE

(71) Applicant: NIPPON TELEGRAPH AND TELEPHONE CORPORATION, Tokyo (JP)

(72) Inventors: Masaki Nakamori, Musashino (JP); Yukihiro Goto, Musashino (JP); Hiroyuki Oshida, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 184 days.

(21) Appl. No.: 17/918,950

(22) PCT Filed: Apr. 22, 2020

(86) PCT No.: PCT/JP2020/017375
§ 371 (c)(1),
(2) Date: Oct. 14, 2022

(87) PCT Pub. No.: WO2021/214917
PCT Pub. Date: Oct. 28, 2021

(65) Prior Publication Data
US 2023/0236005 A1    Jul. 27, 2023

(51) Int. Cl.
*G01B 11/06* (2006.01)
*G01N 21/3563* (2014.01)
*G01N 21/3581* (2014.01)

(52) U.S. Cl.
CPC ......... *G01B 11/06* (2013.01); *G01N 21/3563* (2013.01); *G01N 21/3581* (2013.01)

(58) Field of Classification Search
CPC . G01B 11/06; G01B 11/0625; G01B 11/0633; G01B 11/0675; G01B 11/0683;
(Continued)

(56) References Cited

U.S. PATENT DOCUMENTS

| 6,005,397 A | 12/1999 | Zoughi et al. |
| 2010/0064820 A1* | 3/2010 | David ............ G01N 22/00 73/861.04 |

FOREIGN PATENT DOCUMENTS

| CN | 1804567 A * | 7/2006 | ......... G01B 11/0675 |
| CN | 109556503 A * | 4/2019 | |

(Continued)

*Primary Examiner* — Michael P Stafira
(74) *Attorney, Agent, or Firm* — Harness, Dickey & Pierce, P.L.C.

(57) ABSTRACT

An object permittivity measurement apparatus according to the present disclosure includes: a light wave distance measurement device configured to measure reciprocating time t of a light wave with which an object is irradiated and that is reflected and returned from the object, and calculate a distance L to the object using the following equation (1), $$L=ct/2 \quad (1)$$

c: light speed;

an electromagnetic wave phase measurement device configured to measure a rotated phase φ of an electromagnetic wave having a frequency f with which the object is irradiated and that is reflected and returned from the object; and a permittivity calculation circuit configured to calculate permittivity ε of a foreign material on an object surface using the following equation (2), $$\varphi=4\pi Lf/c+4\pi(\varepsilon)^{1/2}df/c \quad (2)$$

d: a thickness of the foreign material on the object surface.

6 Claims, 4 Drawing Sheets

(58) Field of Classification Search
CPC .......... G01B 2290/70; G01B 9/02007; G01B 11/0641; G01B 2210/56; G01B 9/02027; G01B 11/0666; G01B 11/2441; G01B 15/02; G01B 9/02004; G01B 11/02; G01B 11/14; G01B 11/24; G01B 11/28; G01B 15/00; G01B 15/025; G01B 21/12; G01B 2290/65; G01B 7/06; G01B 9/02003; G01B 9/02021; G01B 11/0616; G01B 11/2433; G01B 7/287; G01B 9/02091; G01B 11/0608; G01B 11/16; G01B 11/25; G01B 17/02; G01B 2290/15; G01B 2290/60; G01B 9/02; G01B 9/02002; G01B 9/02014; G01B 9/02044; G01B 9/02067; G01B 9/02095; G01B 9/02096; G01B 11/0691; G01B 11/2513; G01B 11/30; G01B 11/303; G01B 17/025; G01B 9/02018; G01B 9/02024; G01B 9/0205; G01B 9/02064; G01B 9/02072; G01B 9/02088; G01B 9/0209

See application file for complete search history.

(56) References Cited

FOREIGN PATENT DOCUMENTS

| | | | |
|---|---|---|---|
| JP | H0763705 A | 3/1995 | |
| JP | 200019132 A | 1/2000 | |
| JP | 2007271412 A | 10/2007 | |
| JP | 2017207422 A * | 11/2017 | |
| JP | 2018119929 A * | 8/2018 | ............ G01B 11/06 |
| JP | 2018179663 A * | 11/2018 | |
| JP | 2019007743 A * | 1/2019 | |
| WO | WO-0231537 A1 * | 4/2002 | ............ G01S 13/88 |
| WO | WO-2019172183 A1 | 9/2019 | |

* cited by examiner

PERMITTIVITY MEASURING DEVICE AND THICKNESS MEASURING DEVICE

CROSS-REFERENCE TO RELATED APPLICATIONS

This application is a 371 U.S. National Phase of International Application No. PCT/JP2020/017375, filed on Apr. 22, 2020. The entire disclosure of the above application is incorporated herein by reference.

TECHNICAL FIELD

The present disclosure relates to an object permittivity measurement apparatus and an object permittivity measurement method for measuring permittivity of an object. Furthermore, the present disclosure relates to an object thickness measurement apparatus and an object thickness measurement method for measuring a thickness of the object.

BACKGROUND ART

A method for irradiating an object to be measured with electromagnetic waves having a plurality of frequencies to calculate relative permittivity of the object to be measured has been developed (for example, see PTL 1).

According to this method, the object to be measured is irradiated with the electromagnetic wave, and the relative permittivity of the object to be measured is calculated from a phase change after transmission through the object to be measured and the known thickness of the object to be measured.

CITATION LIST

Patent Literature

PTL 1: JP 2017-207422 A

SUMMARY OF THE INVENTION

Technical Problem

In the method of PTL 1, the object to be measured is irradiated with the electromagnetic waves having the plurality of frequencies, and a phase of the electromagnetic waves after the transmission is measured. For this reason, the method described in PTL 1 cannot be applied to an outdoor communication facility opaque to the electromagnetic wave.

Means for Solving the Problem

A reflection-type measurement using a terahertz wave that is of the electromagnetic wave at frequency $10^{11}$ to $10^{13}$ has been devised in order to enable the measurement of a foreign material on the surface of the object opaque to such electromagnetic waves. The reflective type can also be applied to the object opaque to the electromagnetic wave.

A measurement target of the present disclosure will be described, by way of example, an opaque object, namely, a metal body as the object that reflects the electromagnetic wave, and the foreign material existing on the surface of the opaque object, namely, a metal corrosion portion as the foreign material that reflects a light wave and through which the electromagnetic wave is transmitted. At this point, the terahertz wave at frequency $10^{11}$ to $10^{13}$ is illustrated as an example of the electromagnetic wave.

For the corroded metal body, the light wave is reflected on the surface of the corrosion portion. On the other hand, the terahertz wave is transmitted through the corrosion portion and reflected on the surface of the non-corrosion metal body. Generally, in corrosion in a zinc-plated steel material, zinc on the surface is oxidized and corroded in an initial stage. When the corrosion progresses to disappear plating of zinc, inside iron begins to corrode. A composition of the material changes corresponding to the stage of the corrosion, so that the stage of the corrosion can be estimated by measuring a characteristic of the material on the surface of the metal body.

Thus, for the corroded metal body, the light wave is used to measure a distance to the surface of the corrosion portion and the electromagnetic wave is used to measure a rotation amount of the phase to the surface of the corroded metal body. In measuring the rotation amount of the phase to the surface of the metal body, the rotation amount of the phase increases by the distance from the surface of the corrosion portion to the surface of the metal body as compared to the rotation amount of the phase to the surface of the corrosion portion.

For this reason, the rotation amount of the increased phase may be calculated. When the thickness of the corrosion portion is known, the permittivity of the corrosion portion can be calculated from the rotation amount of the increased phase. When the permittivity of the corrosion portion is known, the thickness of the corrosion portion can be calculated.

Specifically, an object permittivity measurement apparatus according to one aspect of the present invention includes:

a light wave distance measurement device configured to measure reciprocating time t of a light wave with which an object is irradiated and that is reflected and returned from the object, and calculate a distance L to the object using the following equation (1), $$L = ct/2 \tag{1}$$

c: light speed;

an electromagnetic wave phase measurement device configured to measure a rotated phase $\varphi$ of an electromagnetic wave having a frequency f with which the object is irradiated and that is reflected and returned from the object; and a permittivity calculation circuit configured to calculate permittivity $\varepsilon$ of a foreign material on an object surface using the following equation (2), $$\varphi = 4\pi L f/c + 4\pi(\varepsilon)^{1/2} df/c \tag{2}$$

d: a thickness of the foreign material on the object surface.

Specifically, an object permittivity measurement method according to another aspect of the present invention includes:

measuring reciprocating time t of a light wave with which an object is irradiated and that is reflected and returned from the object, and calculating a distance L to the object using the following equation (1), $$L = ct/2 \tag{1}$$

c: light speed;

measuring a rotated phase $\varphi$ of an electromagnetic wave having a frequency f with which the object is irradiated and that is reflected and returned from the object; and calculating permittivity $\varepsilon$ of a foreign material on an object surface using the following equation (2).

$$\varphi = 4\pi L f/c + 4\pi(\varepsilon)^{1/2} df/c \quad (2)$$

d: a thickness of the foreign material on the object surface.

Specifically, an object thickness measurement apparatus according to still another aspect of the present invention includes:

a light wave distance measurement device configured to measure reciprocating time t of a light wave with which an object is irradiated and that is reflected and returned from the object, and calculate a distance L to the object using the following equation (1), $$L = ct/2 \quad (1)$$

c: light speed;

an electromagnetic wave phase measurement device configured to measure a rotated phase φ of an electromagnetic wave having a frequency f with which the object is irradiated and that is reflected and returned from the object; and a thickness calculation circuit configured to calculate a thickness d of a foreign material on an object surface using the following equation (2), $$\varphi = 4\pi L f/c + 4\pi(\varepsilon)^{1/2} df/c \quad (2)$$

ε: permittivity of the foreign material on the object surface.

Specifically, an object thickness measurement method according to yet another aspect of the present invention includes:

measuring reciprocating time t of a light wave with which an object is irradiated and that is reflected and returned from the object, and calculating a distance L to the object using the following equation (1), $$L = ct/2 \quad (1)$$

c: light speed;

measuring a rotated phase φ of an electromagnetic wave having a frequency f with which the object is irradiated and that is reflected and returned from the object; and calculating a thickness d of a foreign material on an object surface using the following equation (2), $$\varphi = 4\pi L f/c + 4\pi(\varepsilon) df/c \quad (2)$$

ε: permittivity of the foreign material on the object surface.

Effects of the Invention

According to the object permittivity measurement apparatus and the object permittivity measurement method of the present disclosure, the permittivity of the foreign material on the object surface can be calculated when the thickness of the foreign material on the object surface is known.

According to the object thickness measurement apparatus and the object thickness measurement method of the present disclosure, the thickness of the foreign material on the object surface can be calculated when the permittivity of the foreign material on the object surface is known.

DESCRIPTION OF EMBODIMENTS

Hereinafter, embodiments of the present disclosure will be described in detail with reference to the drawings. Note that the present disclosure is not limited to the embodiments described below. These embodiments are just illustrative examples, and the present disclosure can be implemented in forms in which various modifications and improvements are added on the basis of knowledge of those skilled in the art. Note that constituent elements with the same reference signs in the specification and the drawings are assumed to be the same constituent elements.

First Embodiment

Figure 1:
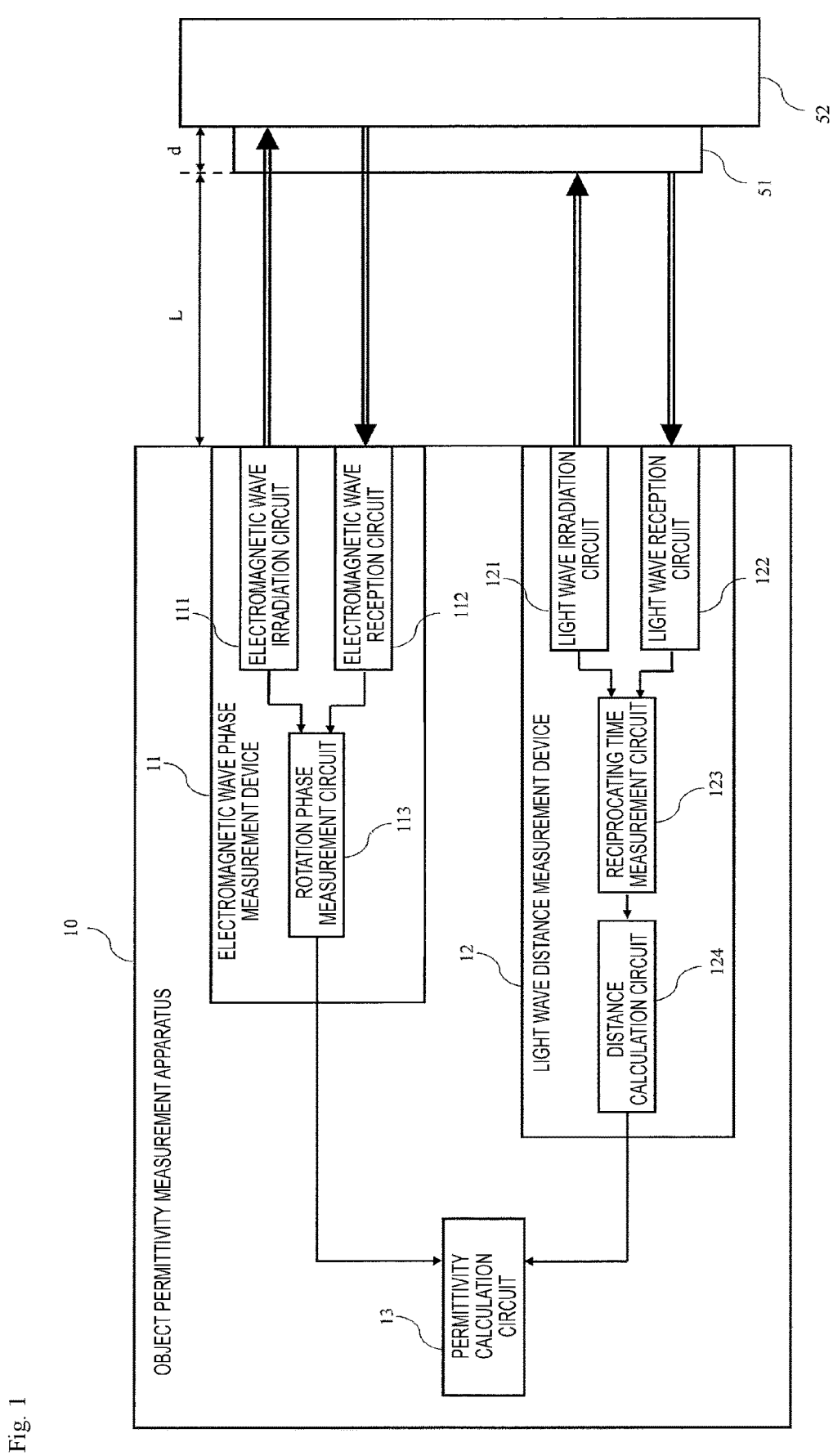
FIG. 1 is a view illustrating a configuration of an object permittivity measurement apparatus.
Figure 2:
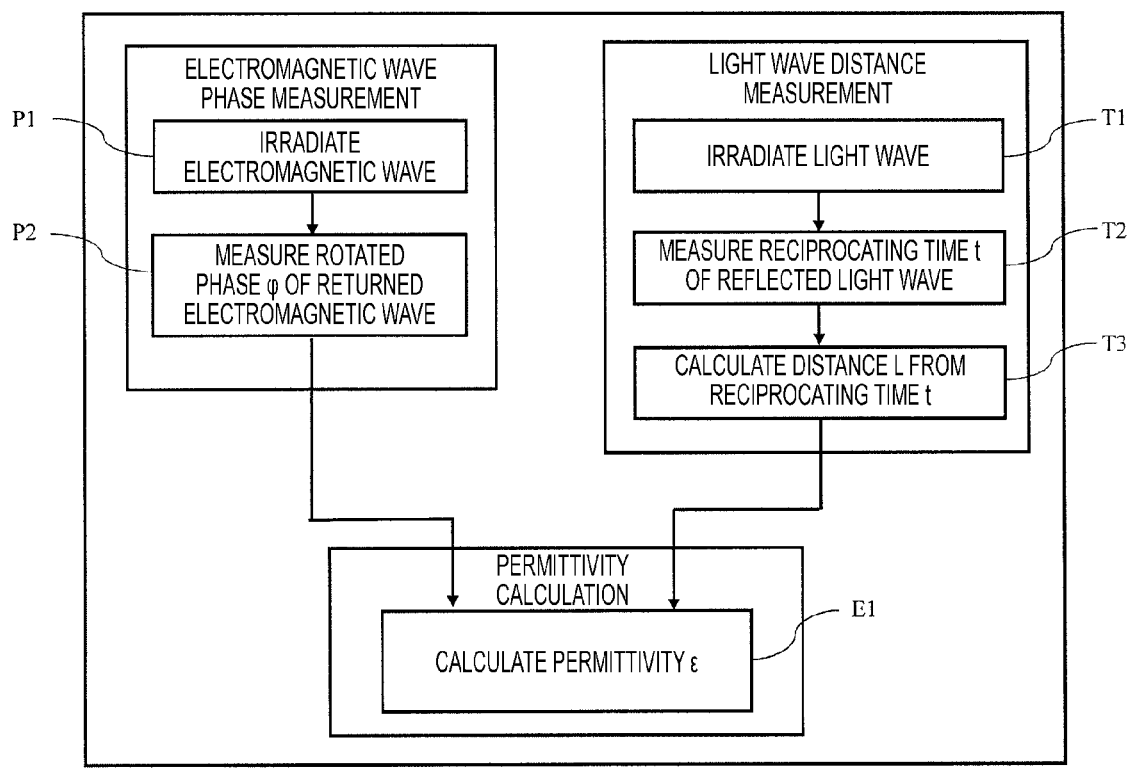
FIG. 2 is a view illustrating an object permittivity measurement method.

FIG. 1 illustrates a configuration of an object permittivity measurement apparatus according to the present disclosure, and FIG. 2 illustrates an object permittivity measurement method. In FIG. 1, the numeral 10 is the object permittivity measurement apparatus, the numeral 51 is a metal corrosion portion, and the numeral 52 is a metal body. The object permittivity measurement apparatus 10 includes an electromagnetic wave phase measurement device 11, a light wave distance measurement device 12, and a permittivity calculation circuit 13. The electromagnetic wave phase measurement device 11 includes an electromagnetic wave irradiation circuit 111, an electromagnetic wave reception circuit 112, and a rotation phase measurement circuit 113. The light wave distance measurement device 12 includes a light wave irradiation circuit 121, a light wave reception circuit 122, a reciprocating time measurement circuit 123, and a distance calculation circuit 124.

Light wave distance measurement will be described with reference to FIGS. 1 and 2. The light wave irradiation circuit 121 irradiates the object that is of the measurement target with the light wave (T1). When a surface of the metal body 52 that is of the object is corroded, the corrosion portion 51 exists as the foreign material on the surface of the metal body 52. The light wave is reflected on the surface of the corrosion portion 51, and the light wave reception circuit 122 receives the reflected light wave. The reciprocating time measurement circuit 123 measures the reciprocating time t since the light wave irradiation circuit 121 irradiates the light wave since the light wave reception circuit 122 receives the returned light wave (T2). A known pulse method and a known FM-CW method can be applied to the measurement of the reciprocating time.

From the reciprocating time t and a light speed c, the distance calculation circuit 124 calculates the distance L from the object permittivity measurement apparatus 10 to the surface of the metal corrosion portion 51 based on the following equation (1) (T3).

$$L = ct/2 \quad (1)$$

Electromagnetic wave phase measurement will be described with reference to FIGS. 1 and 2. The electromagnetic wave irradiation circuit 111 irradiates the object that is of the measurement target with the electromagnetic wave at the frequency f(P1). The electromagnetic wave is transmitted through the corrosion portion 51 and reflected at the surface of the metal body 52, and the electromagnetic wave reception circuit 112 receives the returned electromagnetic wave. The rotation phase measurement circuit 113 measures a rotated phase φ from a difference between the phase of the electromagnetic wave in the irradiation of the electromagnetic wave irradiation circuit 111 and the phase of the electromagnetic wave in the reception of the electromagnetic wave reception circuit (P2).

The permittivity calculation will be described with reference to FIGS. 1 and 2. When the thickness d of the metal corrosion portion 51 that is the foreign material on the object surface is known, the permittivity calculation circuit 13 calculates the permittivity ε of the corrosion portion 51 from the distance L calculated by the equation (1) and the following equation (E1).

$$\varphi = 4\pi Lf/c + 4\pi(\varepsilon)^{1/2} df/c \quad (2)$$

A first term of the equation (2) represents an amount of the phase that rotates while the electromagnetic wave having the frequency f reciprocates between the object permittivity measurement apparatus 10 and the surface of the metal corrosion portion 51. A second term of the equation (2) represents the amount of phase that rotates while the electromagnetic wave having the frequency f reciprocates between the surface of the metal corrosion portion 51 and the surface of the metal body 52.

The permittivity of the corrosion portion that is of the foreign material on the object surface can be calculated when the thickness of the corrosion portion that is of the foreign material on the object surface is known. In particular, when the frequency f of the electromagnetic wave is $10^{11}$ to $10^{13}$, the permittivity of the corrosion portion can be accurately calculated because a large portion of the electromagnetic wave is transmitted through the corrosion portion and reflected by the metal body.

Second Embodiment

Figure 3:
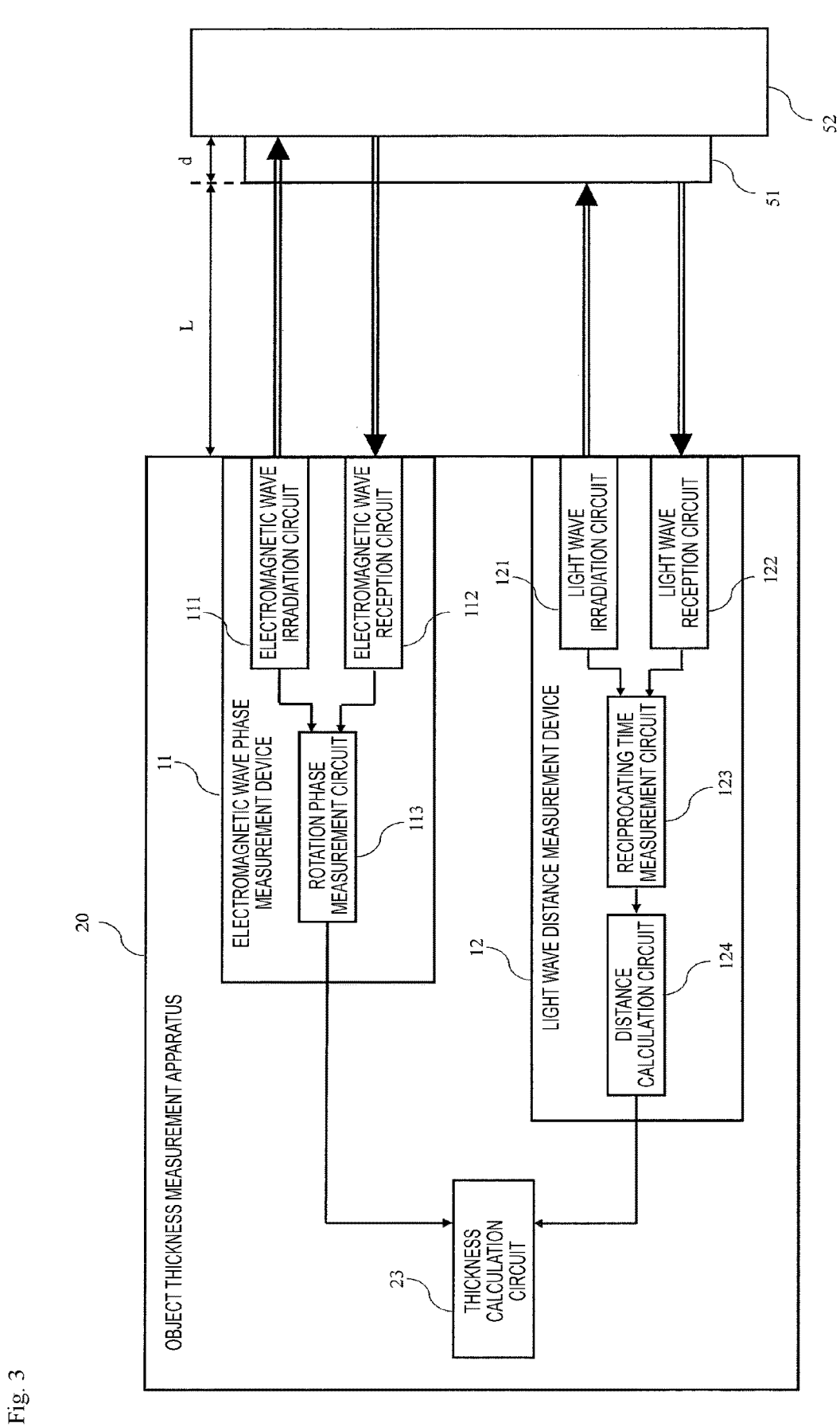
FIG. 3 is a view illustrating a configuration of an object thickness measurement apparatus.
Figure 4:
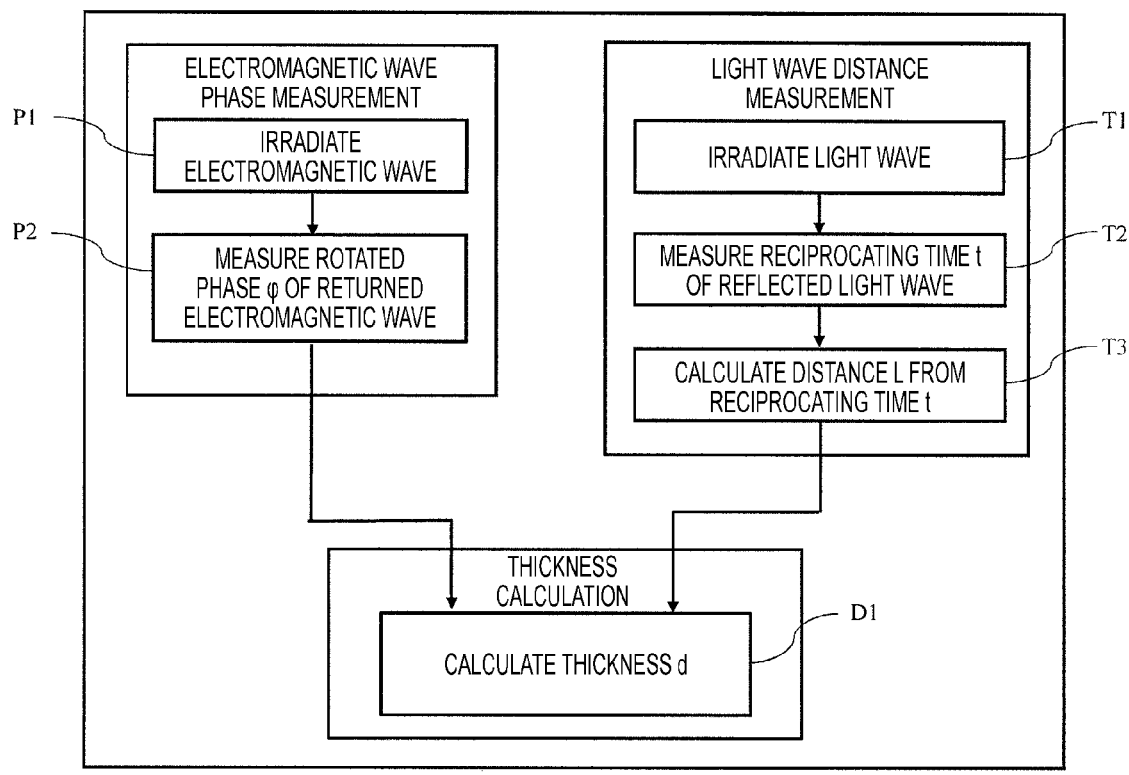
FIG. 4 is a view illustrating an object thickness measurement method.

FIG. 3 illustrates a configuration of an object thickness measurement apparatus of the present disclosure, and FIG. 4 illustrates operation in an object thickness measurement method. In FIG. 3, the numeral 20 is an object thickness measurement apparatus, the numeral 51 is the metal corrosion portion, and the numeral 52 is the metal body. The object thickness measurement apparatus 20 includes the electromagnetic wave phase measurement device 11, the light wave distance measurement device 12, and a thickness calculation circuit 23. The electromagnetic wave phase measurement device 11 includes an electromagnetic wave irradiation circuit 111, an electromagnetic wave reception circuit 112, and a rotation phase measurement circuit 113. The light wave distance measurement device 12 includes a light wave irradiation circuit 121, a light wave reception circuit 122, a reciprocating time measurement circuit 123, and a distance calculation circuit 124.

The light wave distance measurements are described with reference to FIGS. 3 and 4. The light wave irradiation circuit 121 irradiates the object that is of the measurement target with the light wave (T1). When the surface of the metal body 52 that is of the object is corroded, the corrosion portion 51 exists as the foreign material on the surface of the metal body 52. The light wave is reflected on the surface of the corrosion portion 51, and the light wave reception circuit 122 receives the reflected light wave. The reciprocating time measurement circuit 123 measures the reciprocating time t since the light wave irradiation circuit 121 irradiates the light wave since the light wave reception circuit 122 receives the returned light wave (T2). A known pulse method and a known FM-CW method can be applied to the measurement of the reciprocating time.

From the reciprocating time t and the light speed c, the distance calculation circuit 124 calculates the distance L from the object permittivity measurement apparatus 10 to the surface of the metal corrosion portion 51 based on the following equation (1) (T3).

$$L = ct/2 \quad (1)$$

The electromagnetic wave phase measurements are described with reference to FIGS. 3 and 4. The electromagnetic wave irradiation circuit 111 irradiates the object that is of the measurement target with the electromagnetic wave at the frequency f(P1). The electromagnetic wave is transmitted through the corrosion portion 51 and reflected at the surface of the metal body 52, and the electromagnetic wave reception circuit 112 receives the returned electromagnetic wave. The rotation phase measurement circuit 113 measures the rotated phase φ from the difference between the phase of the electromagnetic wave in the irradiation of the electromagnetic wave irradiation circuit 111 and the phase of the electromagnetic wave in the reception of the electromagnetic wave reception circuit (P2).

The thickness calculation will be described with reference to FIGS. 3 and 4. When the permittivity ε of the metal corrosion portion 51 that is of the foreign material of the object surface is known, the thickness calculation circuit 23 calculates the thickness d of the corrosion portion 51 by the following equation (D1).

$$\varphi = 4\pi Lf/c + 4\pi(\varepsilon)^{1/2} df/c \quad (2)$$

The first term of the equation (2) represents the amount of phase that is rotated while the electromagnetic wave having the frequency f reciprocates between the object thickness measurement apparatus 20 and the surface of the metal corrosion portion 51. The second term of the equation (2) represents the amount of phase that rotates while the electromagnetic wave having the frequency f reciprocates between the surface of the metal corrosion portion 51 and the surface of the metal body 52.

The thickness of the corrosion portion that is of the foreign material on the object surface when the permittivity of the corrosion portion that is of the foreign material on the object surface is known. In particular, when the frequency f of the electromagnetic wave is $10^{11}$ to $10^{13}$, the thickness of the corrosion portion can be accurately calculated because the large portion of the electromagnetic wave is transmitted through the corrosion portion and reflected by the metal body.

INDUSTRIAL APPLICABILITY

The present disclosure can be applied in the information communication industry.

REFERENCE SIGNS LIST

10: Object permittivity measurement apparatus
11: Electromagnetic wave phase measurement device
111: Electromagnetic wave irradiation circuit
112: Electromagnetic wave reception circuit
113: Rotation phase measurement circuit
12: Light wave distance measurement device
121: Light wave irradiation circuit
122: Light wave reception circuit
123: Reciprocating time measurement circuit
124: Distance calculation circuit
13: Permittivity calculation circuit
20: Object thickness measurement apparatus 23: Thickness calculation circuit
51: Metal corrosion portion
52: Metal body

The invention claimed is:

1. An object permittivity measurement apparatus comprising:
   a light wave distance measurement device configured to measure reciprocating time t of a light wave with which an object is irradiated and that is reflected and returned from the object, and calculate a distance L to the object using the following equation (1), $$L=ct/2 \qquad (1)$$

c: light speed;
   an electromagnetic wave phase measurement device configured to measure a rotated phase φ of an electromagnetic wave having a frequency f with which the object is irradiated and that is reflected and returned from the object; and
   a permittivity calculation circuit configured to calculate permittivity ε of a foreign material on an object surface using the following equation (2), $$\varphi=4\pi Lf/C+4\pi(\varepsilon)^{1/2}df/c \qquad (2)$$

d: a thickness of the foreign material on the object surface.

2. The object permittivity measurement apparatus according to claim 1, wherein the frequency of the electromagnetic wave is $10^{11}$ to $10^{13}$.

3. An object permittivity measurement method comprising:
   measuring reciprocating time t of a light wave with which an object is irradiated and that is reflected and returned from the object, and calculating a distance L to the object using the following equation (1), $$L=ct/2 \qquad (1)$$

c: light speed;
   measuring a rotated phase φ of an electromagnetic wave having a frequency f with which the object is irradiated and that is reflected and returned from the object; and
   calculating permittivity ε of a foreign material on an object surface using the following equation (2), $$\varphi=4\pi Lf/C+4\pi(\varepsilon)^{1/2}df/c \qquad (2)$$

d: a thickness of the foreign material on the object surface.

4. The object permittivity measurement method according to claim 3, wherein the frequency of the electromagnetic wave is $10^{11}$ to $10^{13}$.

5. An object thickness measurement apparatus comprising:
   a light wave distance measurement device configured to measure reciprocating time t of a light wave with which an object is irradiated and that is reflected and returned from the object, and calculate a distance L to the object using the following equation (1), $$L=ct/2 \qquad (1)$$

c: light speed;
   an electromagnetic wave phase measurement device configured to measure a rotated phase φ of an electromagnetic wave having a frequency f with which the object is irradiated and that is reflected and returned from the object; and
   a thickness calculation circuit configured to calculate a thickness d of a foreign material on an object surface using the following equation (2), $$\varphi=4\pi Lf/c+4\pi(\varepsilon)^{1/2}df/c \qquad (2)$$

ε: permittivity of the foreign material on the object surface.

6. The object thickness measurement apparatus according to claim 5, wherein the frequency of the electromagnetic wave is $10^{11}$ to $10^{13}$.

* * * * *